(12) United States Patent
Park

(10) Patent No.: US 8,476,662 B2
(45) Date of Patent: Jul. 2, 2013

(54) LIGHT EMITTING DEVICE, METHOD FOR MANUFACTURING THE SAME, AND BACKLIGHT UNIT

(75) Inventor: Dong Wook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 198 days.

(21) Appl. No.: 13/005,107

(22) Filed: Jan. 12, 2011

(65) Prior Publication Data

US 2011/0194273 A1 Aug. 11, 2011

(30) Foreign Application Priority Data

Jan. 15, 2010 (KR) ........................ 10-2010-0004104

(51) Int. Cl.
*A47B 19/00* (2006.01)

(52) U.S. Cl.
USPC ..................... 257/98; 257/E33.065; 362/97.1

(58) Field of Classification Search
USPC .................. 362/612, 249.01, 249.02, 249.14, 362/84, 237; 257/94, 98, 99, 100, E33.065, 257/784
See application file for complete search history.

(56) References Cited

U.S. PATENT DOCUMENTS

| | | | | |
|---|---|---|---|---|
| 3,080,675 A * | 3/1963 | Licitis | ........................... | 446/170 |
| 5,907,151 A * | 5/1999 | Gramann et al. | ........... | 250/214.1 |
| 6,060,729 A * | 5/2000 | Suzuki et al. | ................... | 257/99 |
| 6,420,735 B2 * | 7/2002 | Kim | ................................ | 257/95 |
| 6,737,811 B2 * | 5/2004 | Zhang et al. | ..................... | 315/56 |
| 7,453,093 B2 * | 11/2008 | Kim et al. | ........................ | 257/79 |
| 7,514,723 B2 * | 4/2009 | Arndt et al. | ...................... | 257/99 |
| 7,579,629 B2 * | 8/2009 | Inoguchi | ........................... | 257/98 |
| 8,012,778 B2 * | 9/2011 | Kim et al. | ....................... | 438/27 |
| 8,016,471 B2 * | 9/2011 | Pai | ................................ | 362/612 |
| 8,102,047 B2 * | 1/2012 | Shiraki et al. | ................. | 257/713 |
| 8,236,584 B1 * | 8/2012 | Chem et al. | ..................... | 438/26 |
| 2004/0173808 A1 * | 9/2004 | Wu | ................................ | 257/99 |
| 2005/0032257 A1 * | 2/2005 | Camras et al. | ................. | 438/25 |

FOREIGN PATENT DOCUMENTS

| | | |
|---|---|---|
| JP | 2000-261039 A | 9/2000 |
| JP | 2004-179438 A | 6/2004 |
| JP | 2009-188069 A | 8/2009 |

(Continued)

OTHER PUBLICATIONS

Korean Decision to Grant a Patent dated Jul. 5, 2011 issued in Application No. 10-2010-0004104.

(Continued)

*Primary Examiner* — John A Ward
(74) *Attorney, Agent, or Firm* — KED & Associates, LLP

(57) ABSTRACT

Disclosed are a light emitting device, a method of manufacturing the same, and a backlight unit. The light emitting device includes a body including a cavity to open an upper portion, in which the cavity has a sidewall inclined at a first angle with respect to a bottom surface of the cavity, first and second electrodes formed in the body, in which at least portions of the first and second electrodes are formed along the sidewall of the cavity, a light emitting chip over the first electrode, the second electrode, and the bottom surface of the cavity, at least one wire having one end bonded to a top surface of the light emitting chip and an opposite end bonded to a portion of the first and second electrodes over the sidewall of the cavity, and a molding member formed in the cavity to seal the light emitting chip.

20 Claims, 7 Drawing Sheets

FOREIGN PATENT DOCUMENTS

| | | |
|---|---|---|
| KR | 10-2006-0126115 A | 12/2006 |
| KR | 10-2008-0023389 A | 3/2008 |
| KR | 10-2008-0059719 A | 7/2008 |
| KR | 10-2009-0082010 A | 7/2009 |
| KR | 10-2009-0123448 A | 12/2009 |

OTHER PUBLICATIONS

Korean Office Action dated Jan. 5, 2011 issued in Application 10-2010-004104.

* cited by examiner

LIGHT EMITTING DEVICE, METHOD FOR MANUFACTURING THE SAME, AND BACKLIGHT UNIT

CROSS-REFERENCE TO RELATED APPLICATIONS

The present application claims priority under 35 U.S.C. 119 and 35 U.S.C. 365 to Korean Patent Application No. 10-2010-0004104 (filed on Jan. 15, 2010), which is hereby incorporated by reference in its entirety.

BACKGROUND

The embodiment relates to a light emitting device, a method of manufacturing the same, and a backlight unit.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device having a novel structure, a method of manufacturing the same, and a backlight unit.

The embodiment provides a light emitting device capable of reducing color variation and a method of manufacturing the same.

According to the embodiment, a light emitting device includes a body including a cavity to open an upper portion, in which the cavity has a sidewall inclined at a first angle with respect to a bottom surface of the cavity, first and second electrodes formed in the body, in which at least portions of the first and second electrodes are formed along the sidewall of the cavity, a light emitting chip over the first electrode, the second electrode, and the bottom surface of the cavity, at least one wire having one end bonded to a top surface of the light emitting chip and an opposite end bonded to a portion of the first and second electrodes over the sidewall of the cavity, and a molding member formed in the cavity to seal the light emitting chip.

According to the embodiment, a method of manufacturing the light emitting device includes the steps of preparing a body including a cavity to open an upper portion, in which the cavity has a sidewall inclined at a first angle with respect to a bottom surface of the cavity, forming first and second electrodes formed in the body, in which at least portions of the first and second electrodes are formed along the sidewall of the cavity, disposing the body on a support frame, mounting a light emitting chip over one of the body, the first electrode, and the second electrode, bonding one end of at least one wire on a top surface of the light emitting chip, bonding an opposite end of the at least one wire to one of the first and second electrodes over the sidewall of the cavity after the support frame has been inclined at the first angle, and forming a molding member in the cavity after the support frame is inclined corresponding to a horizontal surface.

According to the embodiment, a backlight unit includes a bottom cover, a light guide plate provided in the bottom cover, and a light emitting module provided on at least one lateral surface or a bottom surface of the light guide plate and including a substrate and a plurality of light emitting devices mounted on the substrate, in which the light emitting device includes a body including a cavity to open an upper portion, in which the cavity has a sidewall inclined at a first angle with respect to a bottom surface of the cavity, first and second electrodes formed in the body, in which at least portions of the first and second electrodes are formed along the sidewall of the cavity, a light emitting chip over the first electrode, the second electrode, and the bottom surface of the cavity, at least one wire having one end bonded to a top surface of the light emitting chip and an opposite end bonded to a portion of the first and second electrodes over the sidewall of the cavity, and a molding member formed in the cavity to seal the light emitting chip.

The embodiment can provide a light emitting device having a novel structure and a method of manufacturing the same.

The embodiment can provide a light emitting device capable of reducing color variation and a method of manufacturing the same.

DETAILED DESCRIPTION OF THE EMBODIMENTS

Figure 1:
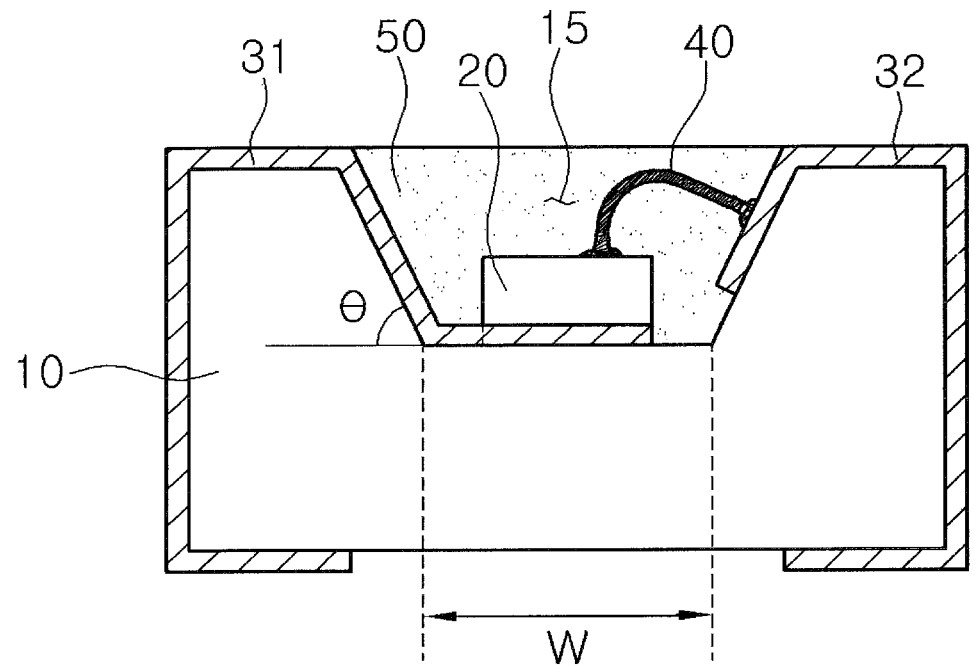
FIG. 1 is a side sectional view showing a light emitting device according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device and a method of manufacturing the same according to the embodiment will be described with reference to accompanying drawings.

FIG. 1 is a side sectional view showing a light emitting device 1 according to the embodiment.

Referring to FIG. 1, the light emitting device 1 includes a body 10, first and second electrodes 31 and 32, a light emitting chip 20, at least one wire 40, and a molding member 50.

The body 10 may include at least one of resin material such as PPA (Polyphthalamide), Si, ceramic material, metallic material, PSG (Photo Sensitive Glass), sapphire ($Al_2O_3$), and a PCB (Printed Circuit Board).

If the body 10 includes material having electrical conductivity, an insulating layer (not shown) may be further formed on a surface of the body 10, thereby preventing the body 10 from being electrically shorted with the electrodes 31 and 32.

A top surface of the body 10 may have various shapes such as a rectangular shape, a polygonal shape, and a circular shape according to the usage and the design of the light emitting device 1.

The body 10 may be provided therein with a cavity 15 such that the body 10 has an open upper portion. The cavity 15 may have a cup shape or a concave container shape. In addition, when viewed in a plan view, the cavity 15 may have a circular shape, a rectangular shape, a polygonal shape, or an oval shape.

A sidewall 16 of the cavity 15 may be inclined at a first angle θ with respect to a bottom surface of the cavity 15. For example, the first angle θ may be in the range of about 30° to 60°. The first angle θ may vary according to the depth of the cavity 15, a height h of the light emitting chip 20, and a light distribution characteristic.

In addition, if the molding member 50 contains a phosphor, a width w of the bottom surface of the cavity 15 may be one time or two times larger than the width of the light emitting chip 20. Since the width w of the bottom surface of the cavity 15 is relatively narrow, the color variation of light emitted from the light emitting chip 20 can be minimized, and details thereof will be described below.

The first and second electrodes 31 and 32 may be formed in the body 10. The first and second electrodes 31 and 32 may be electrically insulated from each other, and may be electrically connected to an external electrode and the light emitting chip 20 to supply power to the light emitting chip 20.

The first and second electrodes 31 and 32 may include metallic material, for example, at least one selected from the group consisting of Ti, Cu, Ni, Au, Cr, Ta, Pt, Sn, Ag, and P. The first and second electrodes 31 and 32 may have a single layer structure or a multi-layer structure, but the embodiment is not limited thereto.

Meanwhile, at least a portion of the first and second electrodes 31 and 32 may be formed along the sidewall 16 of the cavity 15 of the body 10. According to the embodiment, if the width w of the bottom surface of the cavity 15 is one time or two times larger than the width of the light emitting chip 20, the wire 40 cannot be bonded to the second electrode 32 or the first electrode 31 formed on the bottom surface of the cavity 15. Accordingly, wire bonding has to be performed with respect to the first electrode 31 or the second electrode 32 formed on the sidewall 16 of the cavity 15.

The light emitting chip 20 may be mounted on one of the first electrode 31, the second electrode 32, and the bottom surface of the cavity 15 of the body 10.

For example, the light emitting chip 20 may include at least one light emitting diode (LED), and the LED may include a color LED that emits the light having the color of red, green, blue or white and a UV (ultraviolet) LED that emits UV light, but the embodiment is not limited thereto.

The at least one wire 40 may electrically connect the light emitting chip 20 with at least one of the first electrode 31 and the second electrode 32. The at least one wire 40 may include metallic material including at least one of Au, Sn, Ni, Cu, and Ti representing superior bonding strength, but the embodiment is not limited thereto.

In this case, one end of the at least one wire 40 may be bonded to a top surface of the light emitting chip 20, and an opposite end of the at least one wire 40 may be bonded to one of the first and second electrodes 31 and 32 formed at the sidewall 16 of the cavity 15.

However, as described above, since the sidewall 16 of the cavity 15 is inclined at the first angle θ, a defect may occur when the at least one wire 40 is bonded through a typical bonding scheme.

Therefore, according to the embodiment, after the body 10 has been inclined at the first angle θ, the at least one wire 40 is bonded to one of the first and second electrodes 31 and 32 formed on the sidewall 16 of the cavity 15, so that the reliability for the wire bonding scheme can be ensured. The detailed description thereof will be made in the following description about the method of manufacturing the light emitting device 1 according to the embodiment.

The molding member 50 may be formed in the cavity 15 of the body 10 to seal the light emitting chip 20 so that the light emitting chip 20 can be protected.

The molding member 50 may include transmissive resin material or transmissive silicon material, but the embodiment is not limited thereto.

The molding member 50 may include a phosphor. In this case, the wavelength of the light emitted from the light emitting chip 20 is changed by a pump beam of the phosphor. For example, if the light emitting chip 20 includes a blue LED, and the phosphor includes a yellow phosphor to emit a yellow pump beam, blue light emitted from the light emitting chip 20 is mixed with yellow light emitted from the yellow phosphor, thereby generating white light.

Meanwhile, in general, if the molding member includes a phosphor, light emitted from the light emitting chip 20 may be reflected, refracted, or scattered in multiple paths. Accordingly, an output light (lights) of the light emitting device 1 represents color variation according to an optical path difference, so that the quality of the output light may be degraded.

However, according to the embodiment, since the width w of the bottom surface of the cavity 15 of the body 10 is one time to two times larger than the width of the light emitting chip 20, the molding member 50 formed on the light emitting chip 20 has a relatively uniform thickness. Therefore, the optical path difference of the output lights of the light emitting device 1 can be reduced, so that a high-quality light representing low color variation can be generated.

However, if the width w of the bottom surface of the cavity 15 is restricted as described above, an area in which wire bonding is performed with respect to the first and second electrodes 31 and 32 formed on the bottom surface of the cavity 15 cannot be sufficiently ensured. Accordingly, the wire bonding is performed with respect to the first and second electrodes 31 and 32 formed on the sidewall 16 of the cavity.

Hereinafter, the method of manufacturing the light emitting device 1 according to the embodiment will be described in detail.

FIGS. 2 to 7 are sectional views showing the method of manufacturing the light emitting device 1 according to the embodiment.

Figure 2:
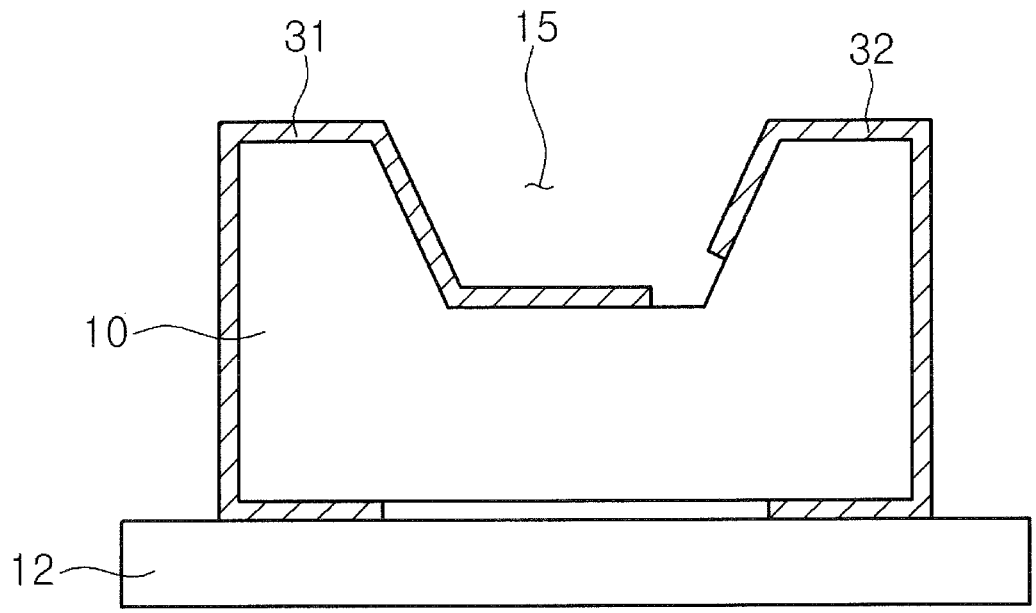
FIGS. 2 to 7 are views showing a method of manufacturing the light emitting device according to the embodiment.

Referring to FIG. 2, the body 10 having the first and second electrodes 31 and 32 is prepared. In this case, the body 10 is fixed onto a support frame 12 to facilitate the manufacturing process of the light emitting device 1.

Figure 3:
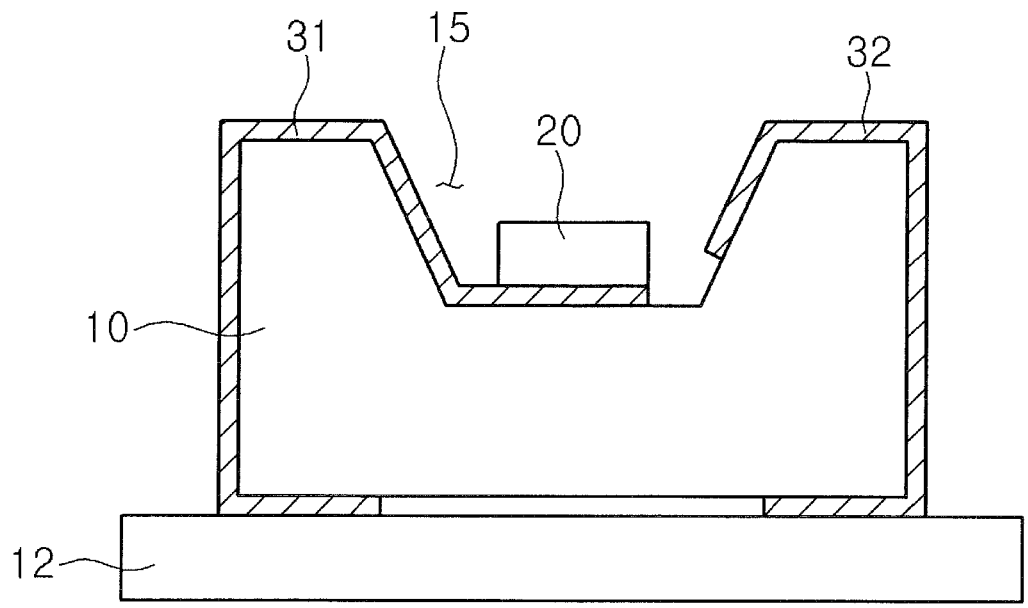

Referring to FIG. 3, the light emitting chip 20 may be mounted on the body 10 and one of the first and second electrodes 31 and 32.

Although not shown, the bonding layer (not shown) may be formed below the light emitting chip 20. The bonding layer may include resin material such as epoxy resin, metallic material such as AuSn, or resin material having conductive filler, which represents a superior adhesive property, but the embodiment is not limited thereto.

Figure 4:
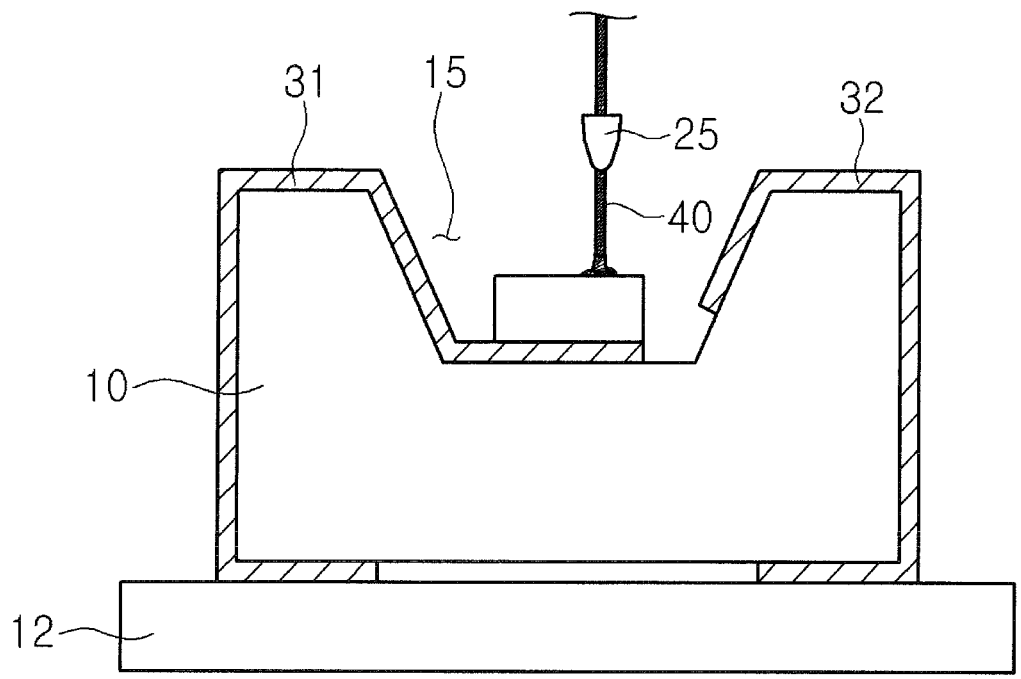

Referring to FIG. 4, after a capillary 25 in which the wire 40 is inserted has been moved onto the light emitting chip 20, one end of the wire 40 may be bonded onto the light emitting chip 20.

In order to bond the wire 40, an electrode pad (not shown) including metallic material including at least one of Au, Ti, Sn, Cu, and Ni representing a superior adhesive property may be formed on the light emitting chip 20, and a ball bump is formed on the electrode pad (not shown), so that the wire 40 may be bonded onto the light emitting chip 20, but the embodiment is not limited thereto.

Figure 5:
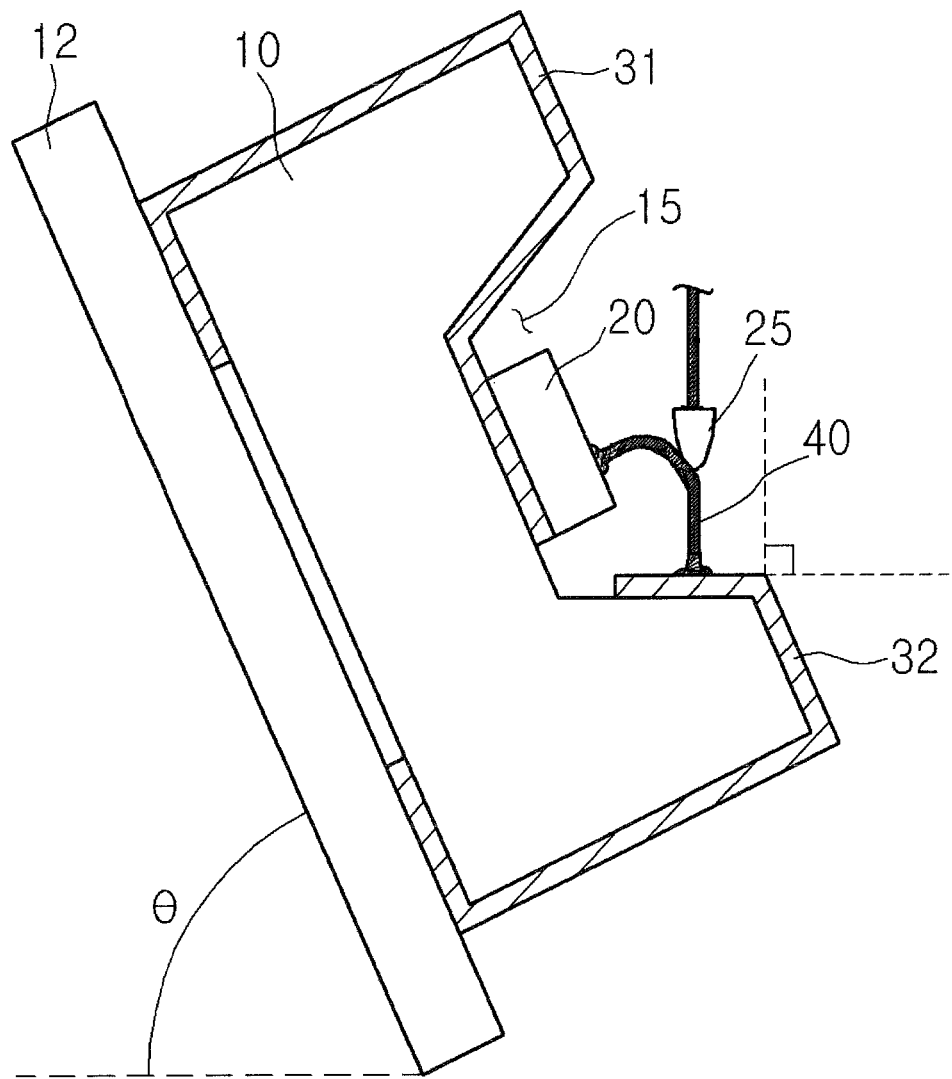

Referring to FIG. 5, after inclining the support frame 12 at the first angle θ, the capillary 25 is moved to one of the first and second electrodes 31 and 32 formed on the sidewall 16 of the cavity 15, so that the opposite end of the wire 40 may be bonded to one of the first and second electrodes 31 and 32.

When the wire bonding is performed by the capillary 25, if the wire bonding is performed with respect to an inclined surface instead of a horizontal surface, wire bonding may be failed or the wire may be frequently disconnected, so that the reliability for the light emitting device may be degraded.

Therefore, according to the method of manufacturing the light emitting device of the embodiment, after inclining the support frame 12 at the first angle θ, the wire bonding is performed by the capillary 25, so that the wire 40 may be stably bonded onto the electrodes 31 and 32 formed on the inclined surface.

Figure 6:
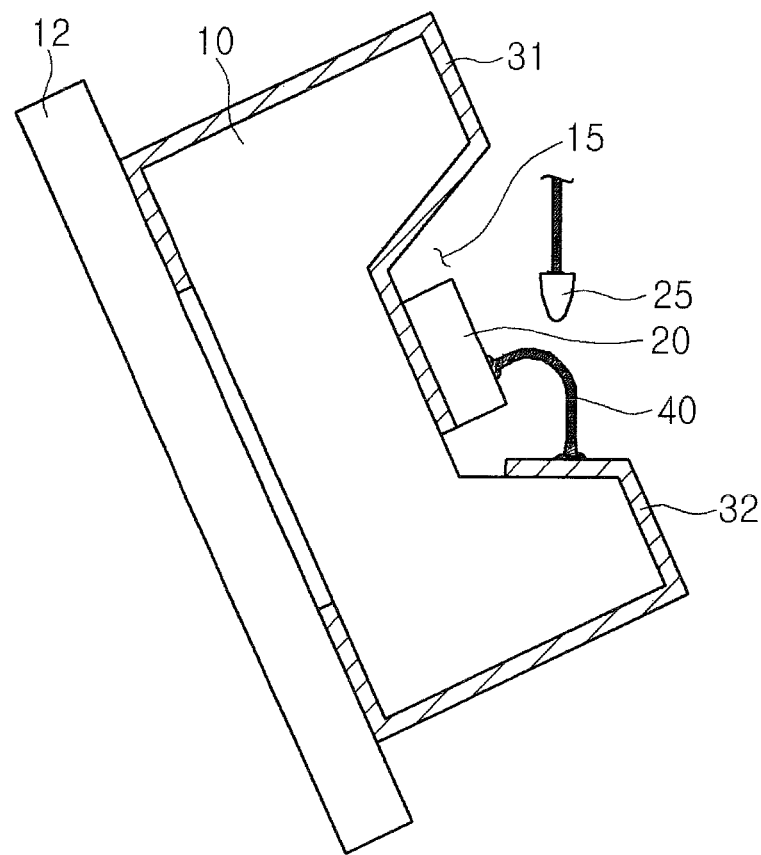

Referring to FIG. 6, after the opposite end of the wire 40 has been bonded to the first and second electrodes 31 and 32, the capillary 25 is lifted and disconnected from the wire 40, so that the wire bonding process can be finished.

Figure 7:
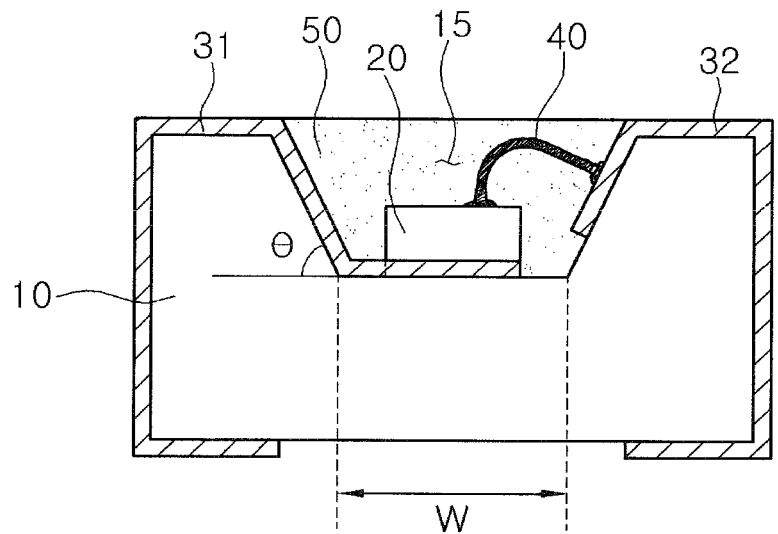

Referring to FIG. 7, after the support frame 12 has been placed on the horizontal plane, the molding member 50 is formed to seal the light emitting chip 20 in the cavity 15 such that the light emitting chip 20 can be protected. Therefore, the light emitting device 1 according to the embodiment can be provided.

The molding member 50 may be formed by hardening silicon or resin material after the silicon or resin material is filled in the cavity 15.

In addition, at least one kind of a phosphor can be contained in the molding member 50.

Although not shown, a lens may be further formed on the molding member 50 to adjust light distribution.

Figure 8:
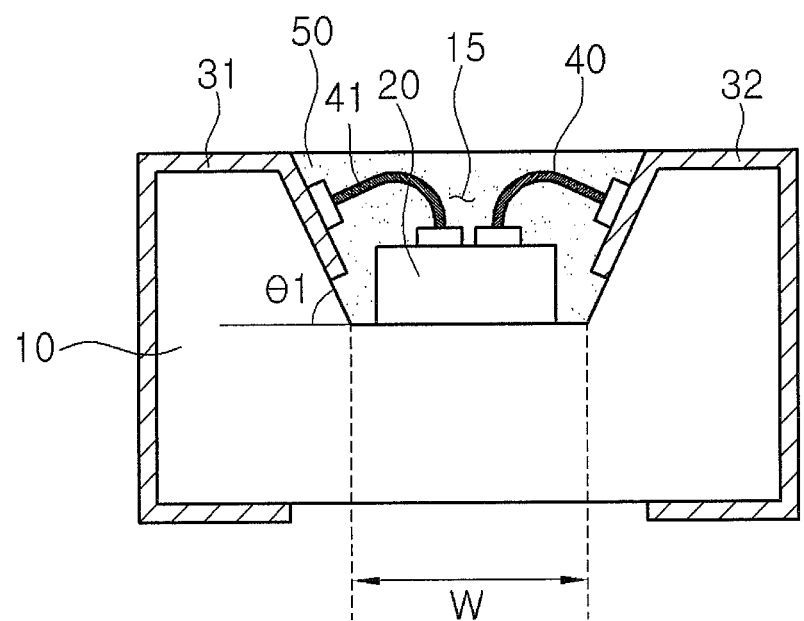
FIG. 8 is a side sectional view showing a light emitting device according to another embodiment of the disclosure.

FIG. 8 is a side sectional view showing a light emitting device according to another embodiment of the disclosure.

Referring to FIG. 8, the light emitting device 1 according to the embodiment includes the body 10, the first electrode 31, the second electrode 32, the light emitting chip 20, two wires 40, and the molding member 50.

The cavity 15 may be formed in the body 10 such that the upper portion of the body 10 may be open. The sidewall 16 of the cavity 15 may be inclined at the first angle θ with respect to the bottom surface of the cavity 15. For example, the first angle θ may be in the range of about 30° to about 60°. However, the first angle θ may vary according to the depth of the cavity 15, the height h of the light emitting chip 20, and a light distribution characteristic of the light emitting chip 20, but the embodiment is not limited thereto.

In addition, if the molding member 50 contains a phosphor, the width w of the bottom surface of the cavity 15 may be 1 to 1.2 times larger than the width of the light emitting chip 20. The width w of the bottom surface of the cavity 15 is relatively narrow, so that the color variation of light emitted from the light emitting chip 20 can be minimized, and details thereof will be given below.

The first and second electrodes 31 and 32 may be formed in the body 10. The first and second electrodes 31 and 32 may be electrically insulated from each other, and may be electrically connected to an external electrode and the light emitting chip 20 to supply power to the light emitting chip 20.

At least portions of the first and second electrodes 31 and 32 may be formed along the sidewall 16 of the cavity 15 of the body 10.

The light emitting chip 20 may be mounted on the bottom surface of the cavity 15 of the body 10.

For example, the light emitting chip 20 may include at least one LED, and the LED may include a color LED that emits the light having the color of red, green, blue or white and a UV (ultraviolet) LED that emits UV light, but the embodiment is not limited thereto.

The two wires 40 and 41 may electrically connect the light emitting chip 20 to the first and second electrodes 31 and 32, respectively. First ends of the two wires 40 and 41 are bonded onto the light emitting chip 20, and second ends of the two wires 40 and 41 are bonded to the first and second electrodes 31 and 32, which are formed on sidewalls 16 of the cavity 15, respectively.

However, as described above, since the sidewalls 16 of the cavity 15 are inclined at the first angle θ, when the two wires 40 and 41 are bonded through a typical bonding scheme, a defect may occur.

Therefore, according to the embodiment, after the body 10 has been inclined at the first angle θ, the two wires 40, 41 are bonded to the first and second electrodes 31 and 32 formed on the sidewalls 16 of the cavity 15, so that the reliability for the wire bonding scheme can be ensured.

In this case, both ends of the wire 40 may have the height identical to that of both ends of the wire 41.

The molding member 50 seals the light emitting chip 20 in the cavity 15 of the body 10 such that the light emitting chip 20 can be protected.

The molding member 50 may include a transmissive resin material or a transmissive silicon material, but the embodiment is not limited thereto.

The molding member 50 may include a phosphor. In this case, the wavelength of the light emitted from the light emitting chip 20 is changed by a pump beam of the phosphor. For example, if the light emitting chip 20 includes a blue LED, and the phosphor includes a yellow phosphor to emit a yellow pump beam, blue light emitted from the light emitting chip 20 may be mixed with yellow light emitted from the yellow phosphor, thereby generating white light.

Meanwhile, in general, if a molding member includes a phosphor, light emitted from a light emitting chip is reflected, refracted, or scattered in multiple paths. Accordingly, an output light (lights) of a light emitting device represents color variation according to an optical path difference, so that the quality of the output light may be degraded.

However, according to the embodiment, since the bottom surface of the cavity 15 of the body 10 has the width w one time to two times larger than the width of the light emitting chip 20, the molding member 50 formed on the light emitting chip 20 has a relatively uniform thickness. Therefore, the optical path difference of the output lights of the light emitting device can be reduced, so that a high-quality light representing low color variation can be generated.

However, if the width w of the bottom surface of the cavity 15 is restricted as described above, the wire bonding may be performed with respect to the first and second electrodes 31 and 32 formed on the sidewalls 16 of the cavity 15.

Figure 9:
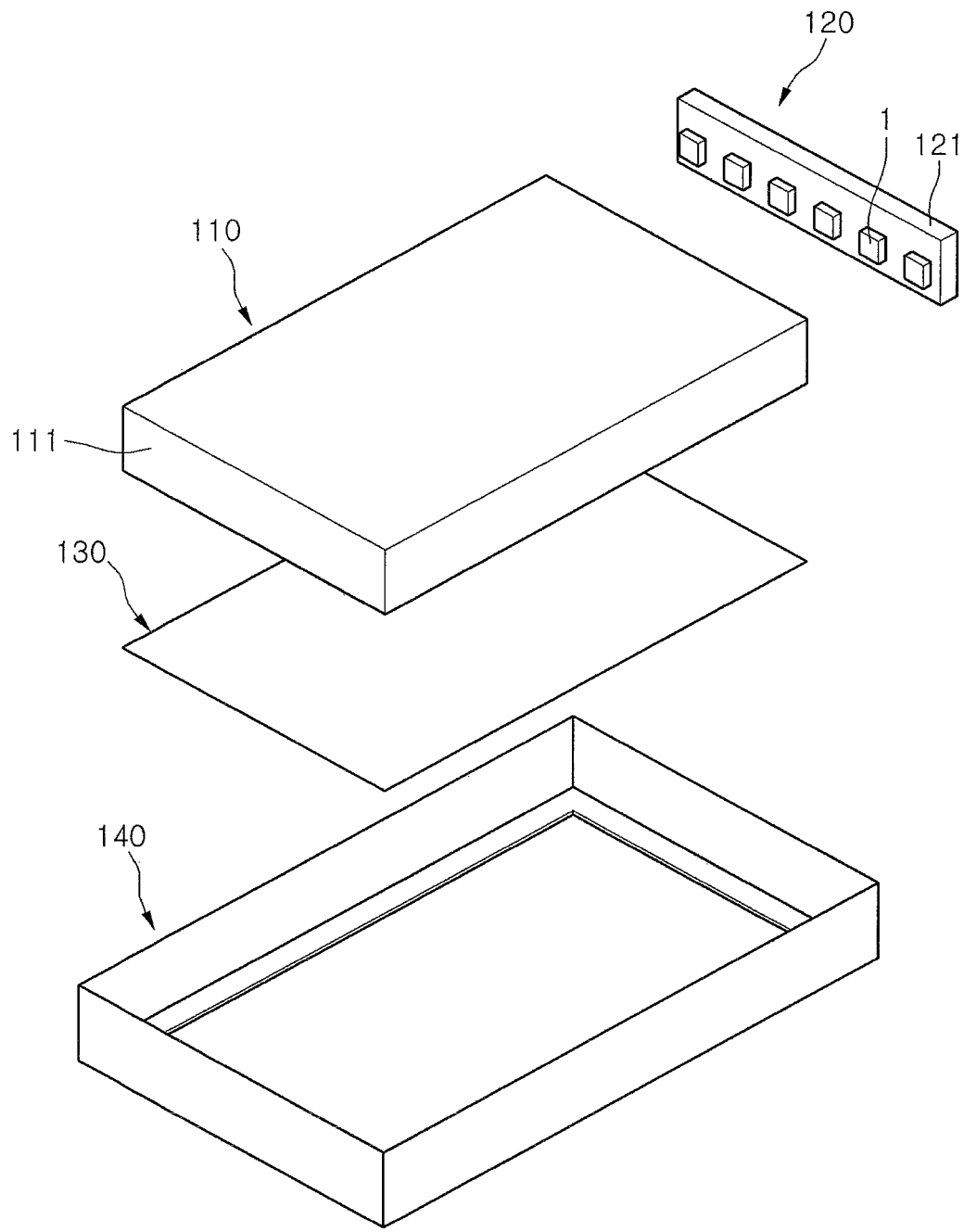
FIG. 9 is a view showing a backlight unit employing the light emitting device according to the embodiment.

FIG. 9 is a view showing a backlight unit employing the light emitting device 1 according to the embodiment.

Referring to FIG. 9, the backlight unit includes a bottom cover 140, a light guide plate 110 provided in the bottom cover 140, and a light emitting module 120 installed at one side or on the bottom surface of the light guide plate 110. In addition, a reflective sheet 130 may be provided under the light guide plate 110.

The bottom cover 140 has a box shape having an open top surface to contain the light guide plate 110, the light emitting module 120 and the reflective sheet 130 therein. In addition, the bottom cover 140 may include metallic material or resin material, but the embodiment is not limited thereto.

The light emitting module 120 includes a substrate 121 and a plurality of light emitting devices 1 according to the embodiment, which are mounted on the substrate 121.

The substrate 121 includes a typical PCB (printed circuit board), an MCPCB (metal core PCB), an FPCB (flexible PCB), or a ceramic PCB, but the embodiment is not limited thereto.

The light emitting devices 1 are mounted on a first surface of the substrate 121 and arranged in the form of an array.

As shown in FIG. 9, the light emitting module 120 may be provided on at least one inner lateral surface of the bottom cover 140 to supply light toward at least one lateral surface of the light guide plate 110.

The light emitting module 120 is provided on a bottom surface of the bottom cover 140 to supply light toward a bottom surface of the light guide plate 110. Such an arrangement can be variously changed according to the design of the backlight unit 1100 and the embodiment is not limited thereto.

The light guide plate 110 may be installed in the bottom cover 140. The light guide plate 110 converts the light emitted from the light emitting module 120 into the surface light to guide the surface light toward a display panel (not shown).

The light guide plate 110 may include one selected from the group consisting of acryl-based resin, such as PMMA (polymethyl methacrylate), PET (polyethylene terephthalate), PC (polycarbonate), COC and PEN (polyethylene naphthalate) resin. For example, the light guide plate 110 may be formed through extrusion molding.

The reflective sheet 130 may be provided under the light guide plate 110. The reflective sheet 130 reflects the light, which is directed downward through the bottom surface of the light guide plate 110, toward the light exit surface of the light guide plate 110.

The reflective sheet 130 may include a material, such as PET, PC or PVC resin, representing superior reflectance, but the embodiment is not limited thereto.

Figure 10:
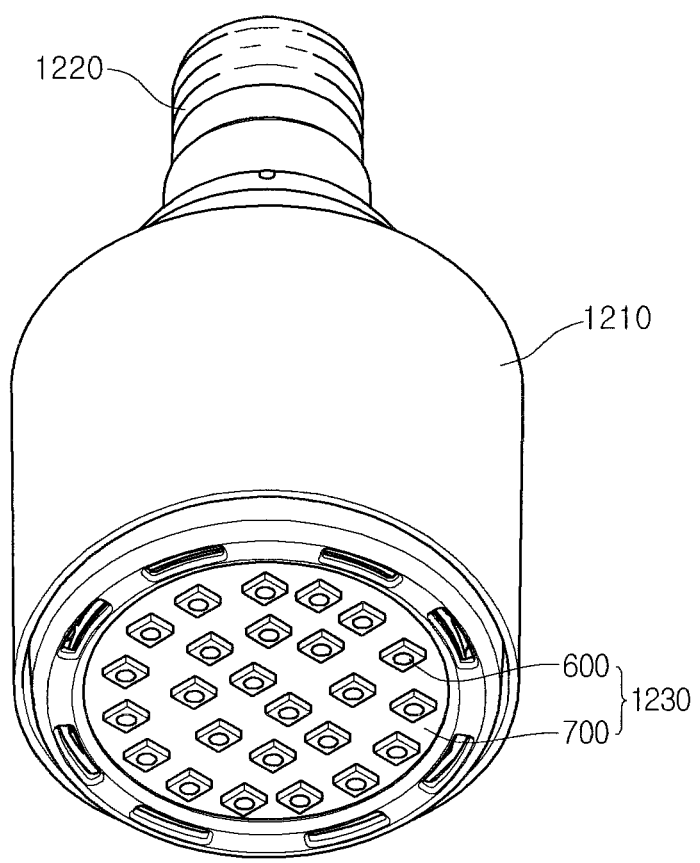
FIG. 10 is a view showing a lighting system employing the light emitting device according to the embodiment.

FIG. 10 is a lighting system 1200 including a light emitting device according to the disclosure. The lighting system 1200 shown in FIG. 10 is one example, but the disclosure is not limited thereto.

Referring to FIG. 9, the lighting system 1200 includes a case body 1210, a light emitting module 1230 installed in the case body 1210, and a connection terminal 1220 installed in the case body 1210 to receive power from an external power source.

Preferably, the case body 1210 includes material having a superior heat dissipation property. For instance, the case body 1210 includes metallic material or resin material.

The light emitting module 1230 may include a substrate 700 and at least one light emitting device 600 installed on the substrate 700.

The substrate 700 includes an insulating member printed with a circuit pattern. For instance, the substrate 700 includes a PCB (printed circuit board), an MCPCB (metal core PCB), an FPCB (flexible PCB), or a ceramic PCB.

In addition, the substrate 700 may include material that effectively reflects the light. The surface of the substrate 700 can be coated with a color, such as a white color or a silver color, to effectively reflect the light.

At least one light emitting device 600 can be installed on the substrate 700.

Each light emitting device 600 may include at least one LED (light emitting diode). The LED may include a color LED that emits the light having the color of red, green, blue or white and a UV (ultraviolet) LED that emits UV light.

The light emitting devices of the light emitting module 1230 can be variously arranged to provide various colors and brightness. For instance, the combination of a white light emitting device, a red light emitting device, and a green light emitting device can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescent materials. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 10, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of a light guide member, a diffusion sheet, a light collection sheet, a brightness enhancement sheet, and a fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device, comprising:
a body including a cavity to open an upper portion, the cavity having a sidewall inclined with respect to a bottom surface of the cavity;

first and second electrodes formed in the body, at least portions of the first and second electrodes being fanned along the sidewall of the cavity;

a light emitting chip disposed on the first electrode;

at least one wire having a first end thereof bonded to a first portion of the second electrode, the first portion of the second electrode having a slanted surface extending along the sidewall of the cavity with respect to the bottom surface of the cavity; and a molding member formed in the cavity to seal the light emitting chip.

2. The light emitting device of claim 1, wherein the sidewall of the cavity is inclined at an angle of about 30° to about 60°.

3. The light emitting device of claim 1, wherein the bottom surface of the cavity has a width one time to two times larger than a width of the light emitting chip.

4. The light emitting device of claim 1, further comprising an electrode pad over the light emitting chip, wherein the wire is bonded to the electrode pad.

5. The light emitting device of claim 1, wherein the molding member includes at least one kind of a phosphor.

6. The light emitting device of claim 1, wherein the light emitting chip includes at least one light emitting diode.

7. The light emitting device of claim 1, wherein the body has a top surface having a rectangular shape, a polygonal shape, or a circular shape.

8. The light emitting device of claim 1, wherein the first and second electrodes extend from an upper portion of the sidewall of the cavity to an outer wall of the body.

9. The light emitting device of claim 8, wherein the bottom surface of the cavity has a width one time to one and half times larger than a width of the light emitting chip.

10. The light emitting device of claim 8, wherein the at least one wire comprises a first wire that connects a first electrode pad of the light emitting chip to the first electrode over the sidewall of the cavity, and a second wire that connects a second electrode pad of the light emitting chip to the second electrode over the sidewall of the cavity.

11. The light emitting device of claim 1, wherein the at least one wire includes a metal material including at least one of Au, Sn, Ni, Cu, or Ti.

12. The light emitting device of claim 1, wherein a second end of the at least one wire is positioned higher than the first end of the at least one wire.

13. The light emitting device of claim 1, wherein the first portion of the second electrode is higher than the top surface of the light emitting chip.

14. A backlight unit, comprising:

a bottom cover;

a light guide plate provided in the bottom cover; and a light emitting module provided on at least one lateral surface or a bottom surface of the light guide plate and including a substrate and a plurality of light emitting devices mounted on the substrate, wherein the light emitting device comprises:

a body including a cavity having a sidewall inclined with respect to a bottom surface of the cavity;

first and second electrodes formed on the body, at least portions of the first and second electrodes being formed along the sidewall of the cavity;

a light emitting chip disposed on the first electrode;

at least one wire having a first end thereof bonded to a first portion of the second electrode, the first portion of the second electrode having a slanted surface extending along the sidewall of the cavity; and a molding member formed in the cavity to seal the light emitting chip.

15. The backlight unit of claim 14, wherein the backlight unit supplies light to a display panel provided on a top surface of the light guide plate.

16. The backlight unit of claim 14, wherein the sidewall of the cavity is inclined at an angle of about 30° to about 60°.

17. The backlight unit of claim 14, wherein the bottom surface of the cavity has a width one time to two times larger than a width of the light emitting chip.

18. The backlight unit of claim 14, wherein a second end of the at least one wire is positioned higher than the first end of the at least one wire.

19. The backlight unit of claim 14, wherein the first portion of the second electrode is higher than the top surface of the light emitting chip.

20. The backlight unit of claim 14, wherein the bottom surface of the cavity has a width one time to one and half times larger than a width of the light emitting chip.

* * * * *